(12) United States Patent
Chae et al.

(10) Patent No.: US 7,759,196 B2
(45) Date of Patent: Jul. 20, 2010

(54) MULTI-BIT NON-VOLATILE MEMORY DEVICE, METHOD OF OPERATING THE SAME, AND METHOD OF FABRICATING THE SAME

(75) Inventors: Soo-doo Chae, Seongnam-si (KR); Moon-kyung Kim, Yongin-si (KR); Jo-won Lee, Suwon-si (KR); Chung-woo Kim, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 117 days.

(21) Appl. No.: 12/209,735

(22) Filed: Sep. 12, 2008

(65) Prior Publication Data

US 2009/0010058 A1 Jan. 8, 2009

Related U.S. Application Data

(62) Division of application No. 11/220,619, filed on Sep. 8, 2005, now abandoned.

(30) Foreign Application Priority Data

Nov. 19, 2004 (KR) ............. 10-2004-0095051

(51) Int. Cl.
*H01L 21/336* (2006.01)
*H01L 29/788* (2006.01)

(52) U.S. Cl. ................... 438/266; 257/316

(58) Field of Classification Search ............. 257/304, 257/311, 315–320; 438/261–267
See application file for complete search history.

(56) References Cited

U.S. PATENT DOCUMENTS

| 6,091,101 | A | 7/2000 | Wang |
| 6,916,702 | B2 | 7/2005 | Chen et al. |
| 6,984,562 | B2 | 1/2006 | Park |
| 7,164,167 | B2 * | 1/2007 | Iwata et al. ............ 257/315 |
| 2003/0235984 | A1 | 12/2003 | Besser et al. |
| 2004/0164359 | A1 | 8/2004 | Iwata et al. |
| 2006/0108629 | A1 * | 5/2006 | Chae et al. ............ 257/315 |

FOREIGN PATENT DOCUMENTS

CN 1230786 A 10/1999

OTHER PUBLICATIONS

Chinese Office Action (with English language translation) dated Apr. 11, 2008.
Chinese Office Action in Application No. 2005100847926 dated Nov. 7, 2008.

* cited by examiner

*Primary Examiner*—Calvin Lee
(74) *Attorney, Agent, or Firm*—Buchanan Ingersoll & Rooney PC

(57) ABSTRACT

A multi-bit non-volatile memory device and methods of operating and fabricating the same may be provided. The memory device may include a channel region formed in a semiconductor substrate, and a source and drain that form a Schottky contact with the channel region. Also, a central gate electrode may be located on a portion of the channel region, and first and second sidewall gate electrodes may be formed on the channel region along the outer sides of the central gate electrode. First and second storage nodes may be formed between the channel region and the sidewall gate electrodes.

12 Claims, 6 Drawing Sheets

MULTI-BIT NON-VOLATILE MEMORY DEVICE, METHOD OF OPERATING THE SAME, AND METHOD OF FABRICATING THE SAME

CROSS-REFERENCE TO RELATED APPLICATIONS

This application is a divisional of U.S. application Ser. No. 11/220,619 filed Sep. 8, 2005, which claims the priority of Korean Patent Application No. 10-2004-0095051, filed on Nov. 19, 2004, in the Korean Intellectual Property Office, the entire contents of which are incorporated herein by reference.

BACKGROUND OF THE DISCLOSURE

1. Field of the Disclosure

Embodiments of the present disclosure relate to a semiconductor memory device, and more particularly to a multi-bit non-volatile memory (NVM) device, a method of operating the same, and a method of fabricating the same.

2. Description of the Related Art

Semiconductor memory devices can be broadly store data in a hard disc and classified as either volatile or non-volatile memory. In order to perform fast data processing when power is being turned on, a volatile memory such as DRAM is employed in an apparatus such as a computer.

However, instead of the DRAM typically used for computers, the growing market for mobile phones and digital cameras has created a demand for non-volatile memory with fast processing speed which can store data regardless of whether power is interrupted.

Flash memory is a widely used type of non-volatile memory device, with a storage node structure for storing electric charge. Two common forms of flash memory are the floating gate type and the SONOS type with an oxide/nitride/oxide (ONO) structure. Hereinafter, a conventional SONOS type non-volatile memory device will be described with reference to FIG. 1.

Referring to FIG. 1, a SONOS type non-volatile memory device uses a nitride layer 120 as a storage node. An oxide layer 115 for tunneling charge or injecting hot carriers is located between the nitride layer 120 and a semiconductor substrate 105.

A blocking insulating film, e.g., a silicon oxide layer, 125 is formed between the nitride layer 120 and a control gate electrode 130. By this construction, the nitride layer 120 as the storage node is separated from the semiconductor substrate 105 and the control gate electrode 130 by the oxide layers 115 and 125. Accordingly, once charge is stored in the nitride layer 120, it can be maintained even if the power supply is cut off.

In this structure, programming is performed to store charge in the nitride layer 120 by supplying a program voltage to the control gate electrode 130. By doing so, the electrons accelerated in source and drain regions 110 are energized and then injected into the nitride layer 120. This method is hot carrier injecting.

Otherwise, the electrons of the semiconductor substrate 105 may be injected into the nitride layer 120 by tunneling, in accordance with a voltage supplied to the control gate electrode 130.

Erasing the charge from the nitride layer 120 is performed by supplying a negative voltage to the control gate electrode 130, or supplying a positive voltage to the semiconductor substrate 105. At this time, the charge stored in the nitride layer 120 is erased by tunneling.

A multi-bit SONOS type non-volatile memory is currently under development. This device utilizes the local pinning of charges stored in the nitride layer 120. That is, when opposite electric fields are applied to both ends of the source and drain regions 110, electrons can be separately stored in both ends of the nitride layer 120.

However, multi-bit operation using the single nitride layer 120 has a problem in that the two different stored charges cannot be distinguished as a gate length is decreased. Moreover, the mixing of the stored charge cannot be completely prevented.

SUMMARY OF THE DISCLOSURE

Embodiments of the present disclosure provide a reliable multi-bit non-volatile memory device.

The present disclosure may also provide a multi-bit operation method of the multi-bit non-volatile memory device.

The present disclosure may also provide a method of fabricating the multi-bit non-volatile memory device.

According to an aspect of the present disclosure, there may be provided a multi-bit non-volatile memory device including a channel region formed in a semiconductor substrate. A source and a drain may be located at the each ends of the channel region of the semiconductor substrate and form a Schottky contact with the channel region, and a central gate electrode may be formed on a portion of the channel region. First and second sidewall gate electrodes may be formed parallel to the central gate electrode on the channel region and along the outer sides of the central gate electrode. Furthermore, a first storage node may be formed between the channel region and the first sidewall gate electrode, and a second storage node may be formed between the channel region and the second sidewall gate electrode.

Here, the source and the drain may be composed of a metal silicide. Moreover, a first insulating layer may be formed between the storage nodes and the channel region, and a second insulating layer may be formed between the storage nodes and the sidewall gate electrodes.

Additionally, a third insulating layer may be formed between the central gate electrode and the channel region. A fourth insulating layer may be added between the central gate electrode and the sidewall gate electrodes.

According to another aspect of the present disclosure, there may be provided a multi-bit non-volatile memory device including a channel region formed in a semiconductor substrate. A source and a drain of a metal silicide may be formed in the semiconductor substrate at the sides of the channel region, and a first insulating layer may be located on a portion of the channel region. A central gate electrode may be located on the first insulating layer, and first and second sidewall gate electrodes may be formed parallel to the central gate electrode on the channel region and along the outer sides of the central gate electrode. A second insulating layer may be located between the sidewall gate electrodes and the central gate electrode, and a first storage node formed between a first sidewall gate electrode and the channel, and a second storage node formed between the second sidewall gate electrode and the channel. A third insulating layer may be located between the storage nodes and the sidewall gate electrodes, and a fourth insulating layer may be located between the storage nodes and the channels. At this time, the storage nodes may be composed of a silicon nitride layer.

According to still another aspect of the present disclosure, there may be provided a method of programming a multi-bit non-volatile memory device using the foregoing device. Here, a program voltage may be selectively supplied to at least one word line after the first and second sidewall gate electrodes are set as first and second word lines and the source and the drain may be grounded. Thus, charge may be stored in the storage node corresponding to the selected word line.

At this time, the channel region may be doped with an n-type impurity, and the program voltage may be positive. Alternatively, the channel region may be doped with a p-type impurity, and the program voltage may be negative.

According to yet another aspect of the present disclosure, there may be provided a method of erasing a multi-bit non-volatile memory device using the foregoing device. Here, an erasing voltage may be selectively supplied to at least one word line after the first and second sidewall gate electrodes are set as first and second word lines and the source and the drain may be grounded. Thus, the charge stored in the storage node corresponding to the selected word line may be erased.

According to another aspect of the present disclosure, there may be provided a method of reading out charge stored in the storage nodes using the foregoing device. Here, the central gate electrode may be selected and supplied with a turn-on voltage, and a positive voltage and a negative voltage may be alternately supplied between the drain and the source. Thus, the amount and direction of a current may be used to determine whether charge is stored in the storage nodes.

At this time, the channel region may be doped with an n-type impurity, and the turn-on voltage may be positive. Also, the channel region may be doped with a p-type impurity, and the turn-on voltage may be negative.

According to another aspect of the present disclosure, there may be provided a method of fabricating a multi-bit non-volatile memory device, including doping an impurity into a semiconductor substrate to form a channel region. After forming a first insulating layer on a portion of the channel region, a central gate electrode layer may be formed on the first insulating layer. Then, the central gate electrode layer and the first insulating layer may be patterned to form a first insulating film and a central gate electrode. A second insulating layer may be formed on the resultant structure including the central gate electrode, and a storage node layer may be formed on the second insulating layer. After forming a third insulating layer on the storage node, a sidewall gate electrode layer may be formed on the third insulating layer. By sequentially anisotropically etching the sidewall gate electrode layer, the third insulating layer, the storage node layer and the second insulating layer, first and second sidewall gate electrodes may be formed along the sides of the central gate electrode. Then, a metal silicide may be formed in the channel region located on the outer sides of the sidewall gate electrodes, thereby forming a source and a drain.

Here, forming the metal silicide may include forming a metal layer, performing thermal treatment and performing selective wet etching.

BRIEF DESCRIPTION OF THE DRAWINGS

The above and other features and advantages of the present disclosure will become more apparent by describing in detail exemplary embodiments thereof with reference to the attached drawings in which.

DETAILED DESCRIPTION OF EXEMPLARY EMBODIMENTS OF THE DISCLOSURE

Figure 1:
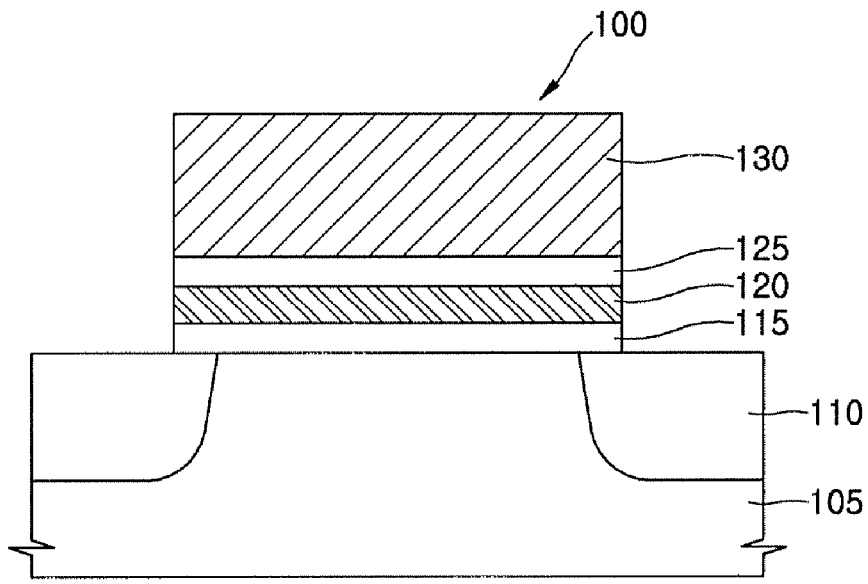
FIG. 1 is a sectional view of a conventional SONOS type non-volatile memory device.

Embodiments of the present disclosure will now be described more fully with reference to the accompanying drawings. The invention may, however, be embodied in many different forms, and should not be construed as being limited to the embodiments set forth herein. In the drawings, the thicknesses of layers and regions may be exaggerated for clarity.

Figure 2:
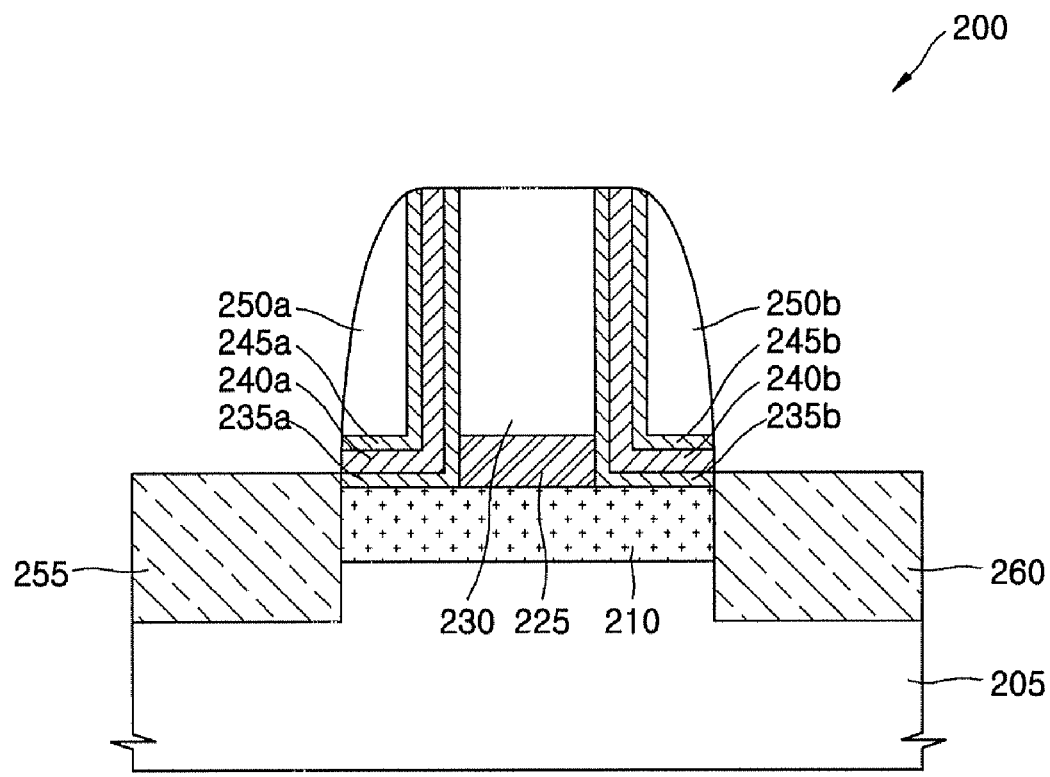
FIG. 2 is a sectional view of a multi-bit non-volatile memory device according to an embodiment of the present disclosure.

FIG. 2 is a sectional view showing a multi-bit non-volatile memory device according to an embodiment of the present disclosure.

Referring to FIG. 2, a multi-bit non-volatile memory device 200 may include a pair of storage nodes 240a and 240b, separated from each other. Also, a pair of sidewall gate electrodes 250a and 250b may be respectively positioned over the storage nodes 240a and 240b. The storage nodes 240a and 240b may store charge.

Tunneling insulating layers 235a and 235b may be located between one of the storage nodes 240a and 240b, and a channel region 210 of a semiconductor substrate 205, e.g., a silicon substrate, respectively. The charge may migrate by tunneling through the tunneling insulating layers 235a and 235b, between the channel region 210 and the storage nodes 240a and 240b. For this reason, the tunneling insulating layers 235a and 235b may have a thickness that allows for charge tunneling under an operating voltage.

Furthermore, blocking insulating film 245a may be located between the storage node 240a and the sidewall gate electrode 250a. Blocking insulating film 245b may be located between the storage node 204b and the sidewall gate electrode 250b. The storage nodes 240a and 240b may be insulated from the sidewall gate electrodes 250a and 250b by the blocking insulating films 245a and 245b, respectively.

More specifically, the storage nodes 240a and 240b may be composed of a silicon nitride layer. At this time, the tunneling insulating layers 235a and 235b and the blocking insulating films 245a and 245b may be composed of a silicon oxide layer. Accordingly, the insulating layers between the sidewall gate electrodes 250a and 250b and the channel region 210 may have an ONO structure of oxide layer/nitride layer/oxide layer.

A left SONOS structure may be formed from the channel region 210 to the left sidewall gate electrode 250a, and a right SONOS structure may be formed from the channel region 210 to the right sidewall gate electrode 250b. Accordingly, two SONOS structures may be provided within a single cell of the non-volatile memory device 200, thereby preparing a memory structure for multi-bit operation. At this time, the channel region may be doped with an n-type impurity or a p-type impurity.

As shown in FIG. 2, a central gate electrode 230 may be located between two sidewall gate electrodes 250a and 250b. Also, a gate insulating layer 225 may be provided between the central gate electrode 230 and the channel region 210. By supplying a voltage higher than a threshold voltage to the central gate electrode 230, the current through the center of the channel region 210 may be controlled.

In more detail, the central gate electrode 230 may include polysilicon, and the gate insulating layer 225 may be composed of a silicon oxide layer. The two sidewall gate electrodes 250a and 250b may include polysilicon.

Preferably, as shown in FIG. 2, the tunneling insulating layers 235a and 235b, the storage nodes 240a and 240b, and the blocking insulating films 245a and 245b may extend between the central gate electrode 230 and the sidewall gate electrodes 250a and 250b, thereby constituting a spacer structure.

A source 255 and a drain 260 may be located on the outer sides of the channel region 210. At this time, the source 255 and the drain 260 may form a Schottky contact with the channel region 210, in contrast to the conventional structure. More specifically, the source 255 and the drain 260 may be composed of a metal silicide.

The metal silicide may be any one material selected from the group consisting of titanium silicide, cobalt silicide, tungsten silicide, nickel silicide and platinum silicide. Such a metal silicide may form the Schottky contact with the silicon of the channel region 210.

Hereinafter, multi-bit operation of the non-volatile memory device 200 may be described.

Figure 3:
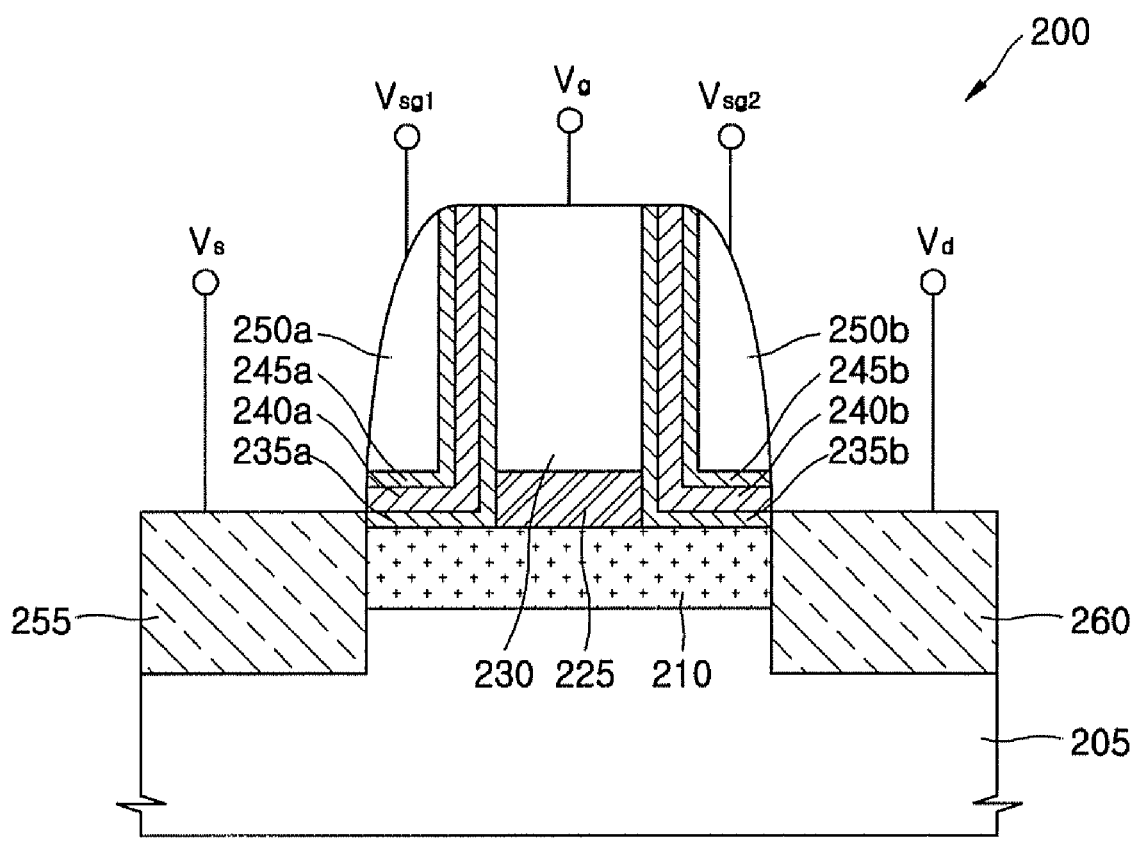
FIG. 3 is a sectional view showing the multi-bit non-volatile memory device and its connection ports according to the embodiment of the present disclosure.

FIG. 3 is a sectional view of the multi-bit non-volatile memory device and its connecting ports according to an embodiment of the present disclosure.

Referring to FIG. 3, a source voltage $V_s$ may be supplied to the source 255, and a drain voltage $V_d$ may be supplied to the drain 260. A gate voltage $V_g$ may be supplied to the central gate electrode 230, a control gate voltage $V_{sg1}$ may be supplied to the left sidewall gate electrode 250a, and another control gate voltage $V_{sg2}$ may be supplied to the right sidewall gate electrode 250b. At this time, the semiconductor substrate 205 may be grounded, although not shown in the drawing.

Here, the polarity of the supplied voltages may be changed according to whether the channel region 210 is doped with an n-type impurity or a p-type impurity. Therefore, each case will be described separately.

The following Table 1 shows programming for the n-type channel.

TABLE 1

|        | $V_{sg1}$ | $V_{sg2}$ | $V_g$ | $V_s$ | $V_d$ |
|--------|-----------|-----------|-------|-------|-------|
| (1, 1) | +         | +         | 0     | 0     | 0     |
| (1, 0) | +         | 0         | 0     | 0     | 0     |
| (0, 1) | 0         | +         | 0     | 0     | 0     |
| (0, 0) | 0         | 0         | 0     | 0     | 0     |

Referring to Table 1, a positive (+) voltage higher than the threshold voltage relative to the channel region (210 of FIG. 3) may be supplied to $V_{sg1}$ or $V_{sg2}$ to selectively store charge in the storage nodes (240a and 240b of FIG. 3), thereby programming the cell.

Here, the state "1" denotes that the storage node is in a programmed state, and "0" denotes an erased state. For example, (1,1) denotes that both storage nodes 240a and 240b are programmed. (1,0) denotes that the left storage node 240a is programmed and the right storage node 240b is erased. Particularly, in case of the n-type channel, stored electrons create a "1" while stored holes create a "0."

At this time, $V_g$, $V_s$ and $V_d$ may be supplied with no voltage or are grounded. Accordingly, without incurring a current flow between the source (255 of FIG. 3) and the drain (260 of FIG. 3), the charge, i.e., electrons, of the channel region 210 may migrate to the storage nodes 240a and 240b by tunneling in accordance with the voltage supplied between the channel region 210 and the sidewall gate electrodes 250a and 250B Table 2 shows erasing to state (0,0) for the n-type channel region.

TABLE 2

|        | $V_{sg1}$ | $V_{sg2}$ | $V_g$ | $V_s$ | $V_d$ |
|--------|-----------|-----------|-------|-------|-------|
| (1, 1) | −         | −         | 0     | 0     | 0     |
| (1, 0) | −         | 0         | 0     | 0     | 0     |
| (0, 1) | 0         | −         | 0     | 0     | 0     |
| (0, 0) | 0         | 0         | 0     | 0     | 0     |

Referring to Table 2, a negative (−) voltage more than the threshold voltage relative to the channel region (210) is supplied to $V_{sg1}$ or $V_{sg2}$ to selectively erase the charge stored in the storage nodes (240a and 240b).

Here, a negative erasing voltage lower than that of the channel region 210 may be supplied to the sidewall gate electrodes 250a and 250b, thereby erasing the charge stored in the storage nodes 240a and 240b.

For example, in order to erase from state (1,0) to state (0,0), the erasing voltage may be supplied only to the left sidewall gate electrode 250a. At this time, $V_g$, $V_s$ and $V_d$ may be supplied with no voltage or are grounded.

Table 3 represents a readout operation for the n-type channel.

TABLE 3

|        | $V_g$ | $V_s$ | $V_d$ | $I_s$ | $I_d$ |
|--------|-------|-------|-------|-------|-------|
| (1, 1) | +     | +     | 0     | 0     | 0     |
| (1, 1) | +     | 0     | +     | 0     | 0     |
| (1, 0) | +     | +     | 0     | +     | −     |
| (1, 0) | +     | 0     | +     | 0     | 0     |
| (0, 1) | +     | +     | 0     | 0     | 0     |
| (0, 1) | +     | 0     | +     | −     | +     |
| (0, 0) | +     | +     | 0     | +     | −     |
| (0, 0) | +     | 0     | +     | −     | +     |

Referring to Table 3, the positive (+) voltage higher than the threshold voltage, i.e., a turn-on voltage, is supplied to $V_g$, and another voltage may be supplied to $V_s$ and $V_d$ alternatively so as to read out individual states. At this time, individual states may be read out by checking the amount and direction of the currents $I_s$ and $I_d$ between the source 255 and the drain 260. At this time, the polarity of the reference characters $I_s$ and $I_d$ denotes the current directions. Also, $V_{sg1}$ and $V_{sg2}$ may be floated or grounded.

As shown in Table 3, bi-directional current combinations between source 255 and the drain 260 may correspond to the respective states on a one-to-one basis. For example, under state (1,1), no current flows regardless of supplying the positive voltage to Vs or Vd. Under state (0,1), no current flows when a positive voltage is supplied to Vs, but a current flows from the drain 260 toward the source 255 when a positive voltage is supplied to Vd.

Hereinafter, the procedure for reading state (1,0) will be given as an example for illustrating the readout operation, with reference to energy bands plotted in FIGS. 4 through 6. Other states will be easily understood by those skilled in the art when considering the example.

Here, the left represents the energy band between the source (255 of FIG. 3) and the channel region (210 of FIG. 3), and the right represents the energy band between the drain (260 of FIG. 3) and the channel region (210 of FIG. 3). Also, reference character $E_f$ denotes the Fermi energy, $E_c$ denotes a conduction band energy, and $E_v$ denotes a valence band energy.

Figure 4:
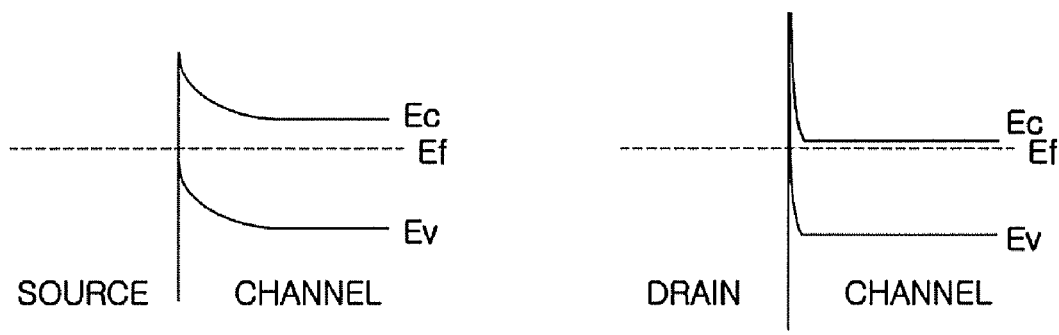
FIGS. 4 through 6 plot energy bands for illustrating a readout operation of the multi-bit non-volatile memory device according to the embodiment of the present disclosure.

FIG. 4 shows the energy band before reading out state (1,0).

Referring to FIG. 4, in state (1,0), electrons are stored in the left storage node (240a of FIG. 3), and holes are stored in the right storage node (240b of FIG. 3).

Accordingly, as shown in the left graphs of FIG. 4, the channel region 210 contacting the source 255 is in a depletion state, and the Schottky barrier becomes raised. Also, the channel region 210 contacting the drain 260 is in an accumulation state as shown in the right graphs of FIG. 4, and the Schottky barrier is lowered. At this time, $E_f$ is determined relatively in accordance with the quantity of stored electrons and holes.

Figure 5:
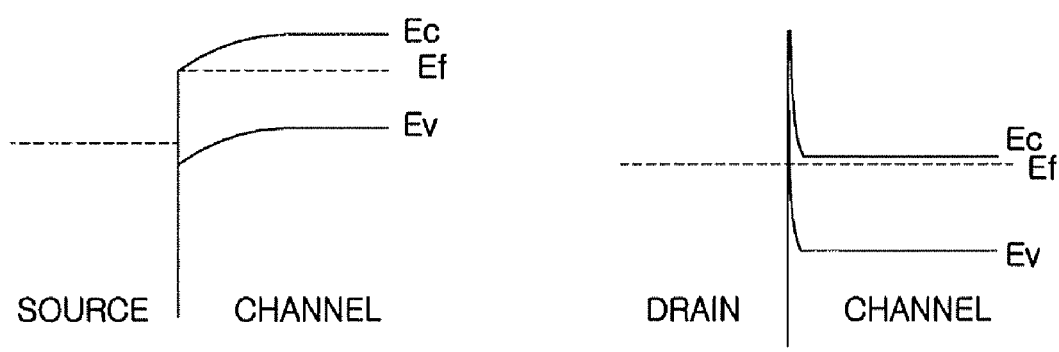

FIG. 5 represents the energy band when a positive voltage is supplied to $V_s$ in state (1,0).

Referring to FIG. 5, the energy band graph shown in FIG. 4 is changed, since the positive voltage is supplied to the source 255. That is, as the positive voltage is supplied to the source 255, the Schottky barrier of the source 255 and the channel region 210 is lowered.

Also, although the drain 260 is grounded, the right storage node 240b stores holes. Accordingly, the effect is as if the right sidewall gate electrode 250b was supplied with a positive voltage. Therefore, the channel region 210 contacting the drain 260 is in an accumulation state, which in turn lowers the Schottky barrier.

At this time, the turn-on voltage is applied to the central gate electrode (230 of FIG. 3). By doing so, the channel region 210 below the central gate electrode 230 is put in an inversion state, to allow current to flow. Thus, current can flow through a junction between the source 255 and the channel region 210, the channel region 210, and a junction between the channel region 210 and the drain 260. In other words, as is shown in [Table 3], the current flows from the source 255 to the drain 260.

Figure 6:
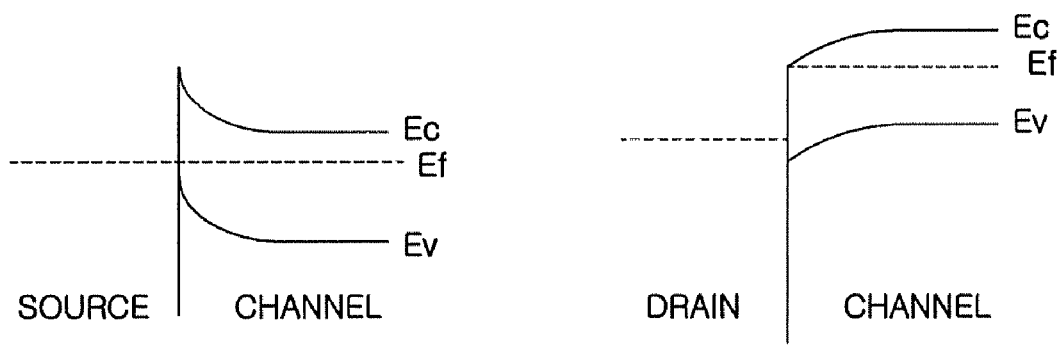

FIG. 6 represents the energy band when a positive voltage is supplied to $V_d$ under state (1,0).

Referring to FIG. 6, as the positive voltage is supplied to the drain 260, the channel region 210 contacting the drain 260 is in the accumulation state as shown in the right graphs, which in turn lowers the Schottky barrier. That is, the current can flow through the junction region between the drain 260 and the channel region 210.

However, as shown in the left graphs of FIG. 6, the source 255 is grounded, as it is before performing the reading out as shown in FIG. 4. That is, the electrons are stored in the left storage node 240a, so that the channel region 210 is in the depletion state. Consequently, the Schottky barrier is heightened. Therefore, no current flows through the junction region between the source 255 and the channel region 210.

At this time, the threshold voltage is supplied to the central gate electrode 230 to invert the channel region 210, thereby allowing the current to flow. However, since the current cannot flow through the junction between the source 255 and the channel region 210, no current flows between the source 255 and the drain 260 as shown in [Table 3].

The readout operation has been described using state (1,0) as an example. Therefore, it is obvious that other states can easily be inferred by those of ordinary skill in the art, using a similar principle and referring to Table 3 and FIGS. 4 through 6.

On the other hand, when the channel region (210 of FIG. 3) is a p-type channel, the present disclosure can be easily adapted by those of ordinary skill in the art, with reference to the n-type state of Table 3, and FIGS. 4 through 6. In this case, the polarities are all the reverse of those for the n-type. For example, for the p-type channel, all positive voltages of [Table 3] are changed to negative voltages when programming. Therefore, negative voltages are supplied to the sidewall gate electrodes (250a and 250b of FIG. 3) that will be programmed with respect to the channel region (210 of FIG. 3). Also, all negative voltages of [Table 4] are changed to the positive voltages when erasing. In other words, the positive voltage with respect to the channel region 210 is supplied to the sidewall gate electrodes 250a and 250b that will be erased with respect to the channel region 210.

The readout operation for the p-type channel may refer to [Table 6]. At this time, the central gate electrode (230 of FIG. 3) is supplied with a negative voltage higher than the threshold voltage, i.e., the turn-on voltage. Furthermore, the selected source 255 and the drain 260 are supplied with a negative voltage instead of a positive voltage. By doing so, the current flowing between the source 255 and the drain 260 is reversed.

As described above, the multi-bit non-volatile memory device 200 according to the present disclosure may allow for individual programming and erasing of the two storage nodes 240a and 240b, respectively. Therefore, multi-bit operation of 2 bits or more may be performed using only a single cell of the multi-bit non-volatile memory device 200.

In addition, the multi-bit non-volatile memory device 200 may enable a stable readout operation by changing the Schottky barrier, because the voltage may be supplied between the source 255 and the drain 260. At this time, the central gate electrode 230 may selectively turned on, so that the cells of a single column or row can be selected from a cell array.

FIGS. 7 through 12 are sectional views showing a method of fabricating the multi-bit non-volatile memory device according to the embodiment of the present disclosure.

Figure 7:
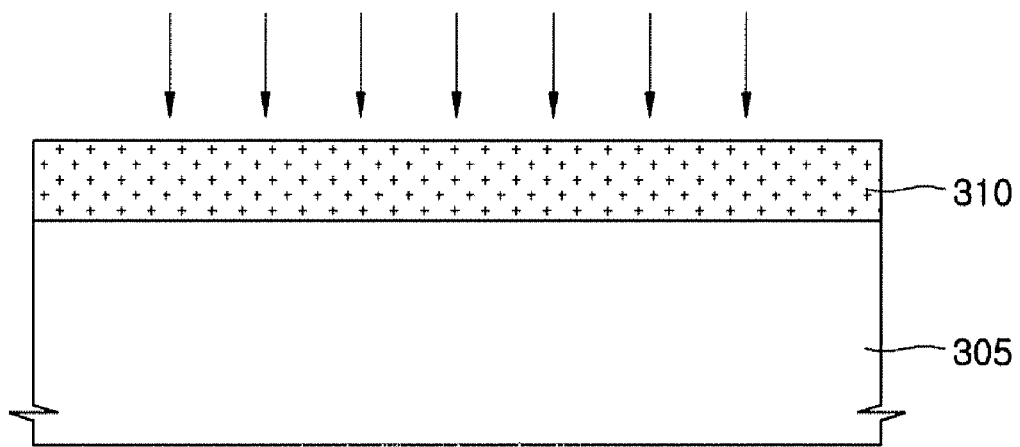
FIGS. 7 through 12 are sectional views showing a method of fabricating the multi-bit non-volatile memory device according to the embodiment of the present disclosure.
Figure 8:
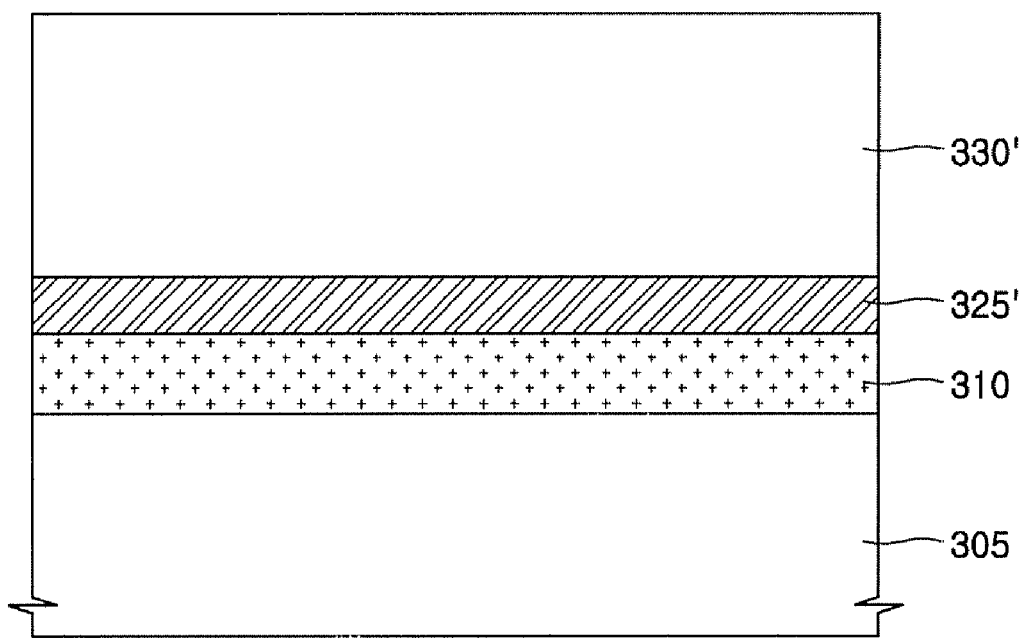

Referring to FIG. 7, a channel region 310 may be formed by doping a surface region of a semiconductor substrate 305. Referring to FIG. 8, a gate insulating layer 325' and a central gate electrode layer 330' may be formed on the channel region 310. At this time, the gate insulating layer 325' may be preferably a silicon oxide layer. The silicon oxide layer may be formed by oxidizing the silicon of the semiconductor substrate 305. Also, the central gate electrode layer 330' may be a polysilicon layer or a composite layer including polysilicon.

Figure 9:
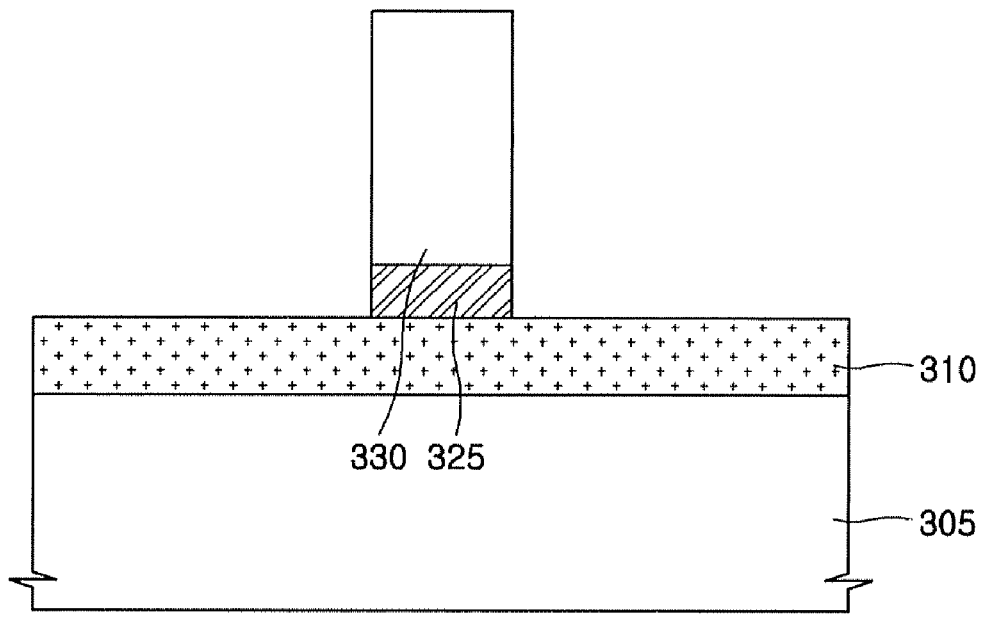

Referring to FIG. 9, the central gate electrode layer 330' and the gate insulating layer 325' may be patterned, thereby forming a central gate electrode 330 and a gate insulating layer 325. The patterning may be performed using photolithography and etching.

Figure 10:
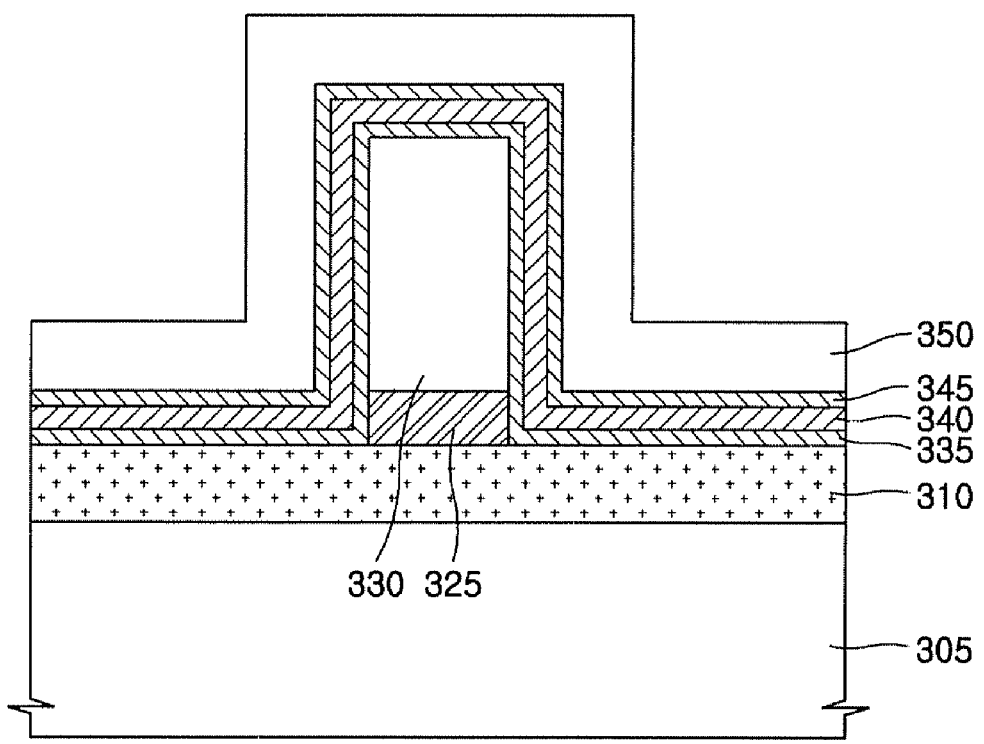

Referring to FIG. 10, a tunneling insulating layer 335, a storage node layer 340, a blocking insulating film 345, and a sidewall gate electrode layer 350 may be sequentially formed on the resultant structure including the central gate electrode 330. At this time, the tunneling insulating layer 335 and the blocking insulating film 345 may each be a silicon oxide layer.

The storage node layer 340 may be a silicon nitride layer. The silicon oxide layers and the silicon nitride layer may be formed by chemical vapor deposition (CVD). Preferably, the sidewall gate electrode layer 350 may be a polysilicon layer or a composite layer including polysilicon.

Figure 11:
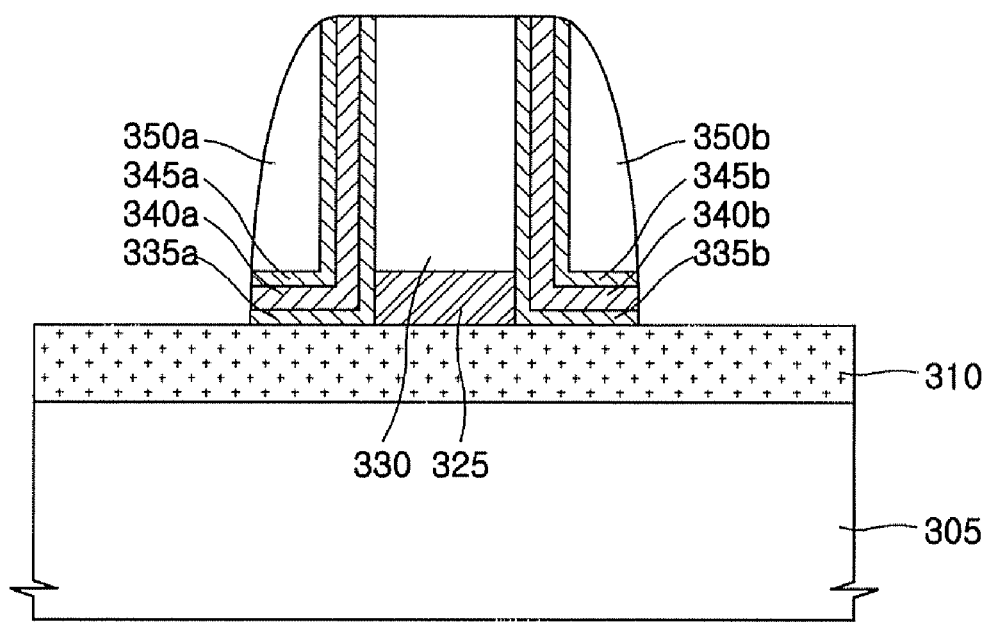

Referring to FIG. 11, the sidewall gate electrode layer 350, the blocking insulating film 345, the storage node layer 340, and the tunneling insulating layer 335 may be sequentially anisotropically etched. By doing so, the sidewall gate electrodes 350a and 350b may be formed as spacers along the sidewalls of the central gate electrode 330. Therefore, the sidewall gate electrodes 350a and 350b may be formed without requiring expensive patterning.

At this time, a blocking insulating film 345a, a storage node 340a and a tunneling insulating layer 335a may be interposed between the left sidewall gate electrode 350a and the central gate electrode 330, and between the left sidewall gate electrode 350a and the channel region 310.

Similarly, a blocking insulating film 345b, a storage node 340b and a tunneling insulating layer 335b may be interposed between the right sidewall gate electrode 350b and the central gate electrode 330, and between the right sidewall gate electrode 350b and the channel region 310.

Figure 12:
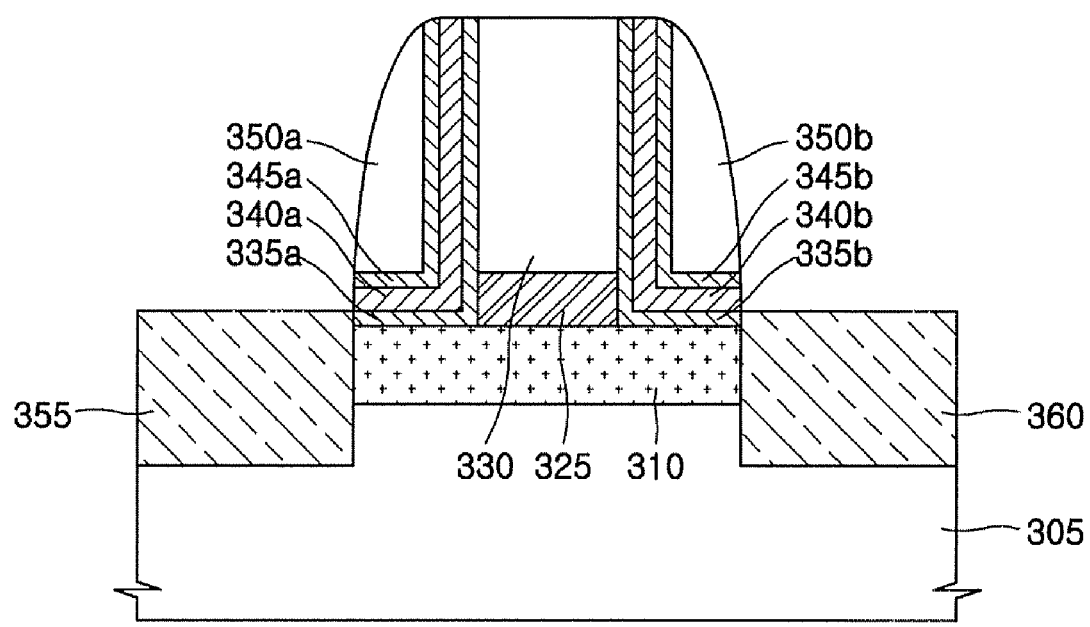

Referring to FIG. 12, a source 355 and a drain 360 may be formed at both ends of the channel region 310. At this time, the source 355 and the drain 360 may be composed of a metal silicide.

The forming the metal silicide may include forming a metal layer, thermal treatment and selective wet etching. At this time, the metal layer may be any one selected from a titanium layer, a cobalt layer, a tungsten layer, a nickel layer and a platinum layer. Also, in view of the substance constituting the metal layer, a thermal treatment may be added after wet etching.

Thereafter, interconnecting may be performed as is well-known in the art. By doing so, the fabrication of the multi-bit non-volatile memory device may be completed.

While the present invention has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A method of programming a multi-bit non-volatile memory device using a multi-bit non-volatile memory device comprising:
   a channel region formed in a semiconductor substrate;
   a source and a drain located at the each ends of the channel region of the semiconductor substrate, and forming a Schottky contact with the channel region;
   a central gate electrode formed on a portion of the channel region;
   first and second sidewall gate electrodes formed parallel to the central gate electrode on the channel region and along the outer sides of the central gate electrode; and
   a first tunneling insulating layer, a first storage node and a first blocking insulating film formed between the channel region and the first sidewall gate electrode and a second tunnel insulating layer, a second storage node and a second blocking insulating film formed between the channel region and the second sidewall gate electrode,
   wherein a program voltage is selectively supplied to at least one word line after the first and second sidewall gate electrodes are set as first and second word lines and the source and the drain are grounded, thereby storing charge in the storage node corresponding to the selected word line.

2. The method of claim 1, wherein the central gate electrode is grounded.

3. The method of claim 1, wherein the channel region is doped with an n-type impurity, and the program voltage is positive.

4. The method of claim 1, wherein the channel region is doped with a p-type impurity, and the program voltage is negative.

5. A method of erasing a multi-bit non-volatile memory device using the device of claim 1,
   wherein an erasing voltage is selectively supplied to at least one word line after the first and second sidewall gate electrodes are set as first and second word lines and the source and the drain are grounded, thereby erasing charge from the storage node corresponding to the selected word line.

6. The method of claim 5, wherein the central gate electrode is grounded.

7. The method of claim 5, wherein the channel region is doped with an n-type impurity, and the erasing voltage is negative.

8. The method of claim 5, wherein the channel region is doped with a p-type impurity, and the erasing voltage is positive.

9. A method of reading out charge stored in storage nodes using the device of claim 1,
   wherein the central gate electrode is selected and supplied with a turn-on voltage, and a positive voltage and a negative voltage are alternately supplied between the drain and the source, so that the amount and direction of a current are used to determine whether charge is stored in the storage nodes.

10. The method of claim 9, wherein the sidewall gate electrodes are grounded.

11. The method of claim 9, wherein the channel region is doped with an n-type impurity, and the turn-on voltage is positive.

12. The method of claim 9, wherein the channel region is doped with a p-type impurity, and the turn-on voltage is negative.

* * * * *